United States Patent
Liao et al.

(10) Patent No.: US 8,996,597 B2
(45) Date of Patent: Mar. 31, 2015

(54) NYQUIST CONSTRAINED DIGITAL FINITE IMPULSE RESPONSE FILTER

(75) Inventors: Yu Liao, Longmont, CO (US); Hongwei Song, Longmont, CO (US); Jingfeng Liu, Longmont, CO (US); Haotian Zhang, Longmont, CO (US)

(73) Assignee: LSI Corporation, Milpitas, CA (US)

( * ) Notice: Subject to any disclaimer, the term of this patent is extended or adjusted under 35 U.S.C. 154(b) by 680 days.

(21) Appl. No.: 13/272,209

(22) Filed: Oct. 12, 2011

(65) Prior Publication Data

US 2013/0097213 A1    Apr. 18, 2013

(51) Int. Cl.
G06F 17/10 (2006.01)
G06F 17/15 (2006.01)
H03H 17/06 (2006.01)
H03H 17/02 (2006.01)

(52) U.S. Cl.
CPC .............. *G06F 17/15* (2013.01); *H03H 17/06* (2013.01); *H03H 2017/0222* (2013.01)
USPC ........................... 708/300; 708/306; 708/311

(58) Field of Classification Search
None
See application file for complete search history.

(56) References Cited

U.S. PATENT DOCUMENTS

| | | | |
|---|---|---|---|
| 5,278,703 A | 1/1994 | Rub et al. | |
| 5,278,846 A | 1/1994 | Okayama | |
| 5,317,472 A | 5/1994 | Schweitzer, III | |
| 5,325,402 A | 6/1994 | Ushirokawa | |
| 5,353,306 A * | 10/1994 | Yamamoto | 375/233 |
| 5,392,299 A | 2/1995 | Rhines | |
| 5,417,500 A | 5/1995 | Martinie | |
| 5,513,192 A | 4/1996 | Janku | |
| 5,523,903 A | 6/1996 | Hetzler | |
| 5,550,810 A | 8/1996 | Monogioudis et al. | |
| 5,550,870 A | 8/1996 | Blaker | |
| 5,612,964 A | 3/1997 | Haraszti | |
| 5,710,784 A | 1/1998 | Kindred | |
| 5,717,706 A | 2/1998 | Ikeda | |
| 5,802,118 A | 9/1998 | Bliss | |
| 5,805,241 A * | 9/1998 | Limberg | 348/725 |
| 5,844,945 A | 12/1998 | Nam | |
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |
| 6,005,897 A | 12/1999 | McCallister | |
| 6,023,783 A | 2/2000 | Divsalar | |
| 6,029,264 A | 2/2000 | Kobayashi | |
| 6,065,149 A | 5/2000 | Yamanaka | |

(Continued)

OTHER PUBLICATIONS

Axvig et al., "Average Min-Sum Decoding of LDPC Codes", 5th International Symposium on Turbo Codes and Related Topics (2008).

(Continued)

*Primary Examiner* — Michael D Yaary
(74) *Attorney, Agent, or Firm* — Hamilton DeSanctis & Cha

(57) ABSTRACT

Various embodiments of the present invention provide apparatuses and methods for filtering a digital signal with a Nyquist constrained digital finite impulse response filter. For example, an apparatus for filtering digital data is disclosed that includes a digital finite impulse response filter having a plurality of taps. The apparatus also includes a tap weight controller connected to the digital finite impulse response filter, operable to adjust a tap weight for each of a subset of the taps such that a magnitude of a Nyquist response of the digital finite impulse response filter remains within a constraint range.

20 Claims, 5 Drawing Sheets

(56) References Cited

U.S. PATENT DOCUMENTS

| | | | |
|---|---|---|---|
| 6,097,764 | A | 8/2000 | McCallister |
| 6,145,110 | A | 11/2000 | Khayrallah |
| 6,178,056 | B1 * | 1/2001 | Cloke et al. .................. 360/46 |
| 6,216,249 | B1 | 4/2001 | Bliss |
| 6,216,251 | B1 | 4/2001 | McGinn |
| 6,266,795 | B1 | 7/2001 | Wei |
| 6,317,472 | B1 | 11/2001 | Choi |
| 6,351,832 | B1 | 2/2002 | Wei |
| 6,377,610 | B1 | 4/2002 | Hagenauer |
| 6,381,726 | B1 | 4/2002 | Weng |
| 6,473,878 | B1 | 10/2002 | Wei |
| 6,535,553 | B1 | 3/2003 | Limberg et al. |
| 6,625,775 | B1 | 9/2003 | Kim |
| 6,748,034 | B2 | 6/2004 | Hattori |
| 6,757,862 | B1 | 6/2004 | Marianetti, II |
| 6,785,863 | B2 | 8/2004 | Blankenship |
| 6,810,502 | B2 | 10/2004 | Eidson |
| 6,970,511 | B1 | 11/2005 | Barnette |
| 6,986,098 | B2 | 1/2006 | Poeppelman |
| 7,047,474 | B2 | 5/2006 | Rhee |
| 7,058,873 | B2 | 6/2006 | Song |
| 7,073,118 | B2 | 7/2006 | Greenberg |
| 7,093,179 | B2 | 8/2006 | Shea |
| 7,117,427 | B2 | 10/2006 | Ophir |
| 7,133,228 | B2 | 11/2006 | Fung |
| 7,184,486 | B1 | 2/2007 | Wu |
| 7,191,378 | B2 | 3/2007 | Eroz |
| 7,203,887 | B2 | 4/2007 | Eroz |
| 7,248,630 | B2 | 7/2007 | Modrie |
| 7,257,764 | B2 | 8/2007 | Suzuki |
| 7,308,061 | B1 | 12/2007 | Huang |
| 7,310,768 | B2 | 12/2007 | Eidson |
| 7,313,750 | B1 | 12/2007 | Feng |
| 7,370,258 | B2 | 5/2008 | Iancu |
| 7,415,651 | B2 | 8/2008 | Argon |
| 7,421,017 | B2 | 9/2008 | Takatsu |
| 7,502,189 | B2 | 3/2009 | Sawaguchi |
| 7,523,375 | B2 | 4/2009 | Spencer |
| 7,587,657 | B2 | 9/2009 | Haratsch |
| 7,590,168 | B2 | 9/2009 | Raghavan |
| 7,646,829 | B2 | 1/2010 | Ashley |
| 7,702,986 | B2 | 4/2010 | Bjerke |
| 7,705,761 | B2 | 4/2010 | Tietjen et al. |
| 7,715,471 | B2 | 5/2010 | Werner |
| 7,752,523 | B1 | 7/2010 | Chaichanavong |
| 7,779,325 | B2 | 8/2010 | Song |
| 7,802,172 | B2 | 9/2010 | Vila Casado |
| 7,958,425 | B2 | 6/2011 | Chugg |
| 7,996,746 | B2 | 8/2011 | Livshitz |
| 8,018,360 | B2 | 9/2011 | Nayak |
| 8,046,666 | B2 | 10/2011 | Park et al. |
| 8,201,051 | B2 | 6/2012 | Tan |
| 8,208,213 | B2 | 6/2012 | Liu |
| 8,291,284 | B2 | 10/2012 | Savin |
| 2006/0123285 | A1 | 6/2006 | De Araujo et al. |
| 2008/0069373 | A1 | 3/2008 | Jiang |
| 2008/0304558 | A1 | 12/2008 | Zhu et al. |
| 2009/0002862 | A1 | 1/2009 | Park et al. |
| 2009/0132893 | A1 | 5/2009 | Miyazaki |
| 2009/0185643 | A1 | 7/2009 | Fitzpatrick |
| 2011/0072335 | A1 | 3/2011 | Liu et al. |
| 2011/0075569 | A1 | 3/2011 | Marrow |
| 2011/0164332 | A1 | 7/2011 | Cao |
| 2011/0167227 | A1 | 7/2011 | Yang et al. |
| 2012/0019946 | A1 | 1/2012 | Aravind |
| 2012/0056612 | A1 | 3/2012 | Mathew |
| 2012/0069891 | A1 | 3/2012 | Zhang |
| 2012/0124119 | A1 | 5/2012 | Yang |
| 2012/0236430 | A1 | 9/2012 | Tan |

OTHER PUBLICATIONS

Bahl et al., "Optimal decoding of linear codes for minimizing symbol error rate", IEEE Trans. Inform. Theory, vol. 20, pp. 284-287 (Mar. 1974).

Blaum, "High-Rate Modulation Codes for Reverse Concatenation", IEEE Transactions on Magnetics, vol. 43, No. 2 (Feb. 2007).

Casado et al., Multiple-rate low-density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Shokrollahi "LDPC Codes: An Introduction", Digital Fountain, Inc. (Apr. 2, 2003).

Spagnol et al, "Hardware Implementation of GF($2^\wedge$m) LDPC Decoders", IEEE Transactions on Circuits and Systemssi: Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/239,719, Unpublished, filed Sep. 22, 2011 (Haitao Xia).

Vasic, B., "High-Rate Girth-Eight Codes on Rectangular Integer Lattices", IEEE Trans. Communications, vol. 52, Aug. 2004, pp. 1248-1252.

Vasic, B., "High-Rate Low-Density Parity-Check Codes Based on Anti-Pasch Affine Geometries," Proc ICC 2002, pp. 1332-1336.

Weon-Cheol Lee et al., "Vitierbi Decoding Method Using Channel State Info. In COFDM System" IEEE Trans. on Consumer Elect., IEEE Service Center, NY, NY vol. 45, No. 3 Aug. 1999.

Yeo et al., "VLSI Architecture for Iterative Decoders in Magnetic Storage Channels", Mar. 2001, pp. 748-755, IEEE trans. Magnetics, vol. 37, No. 2.

(56) References Cited

OTHER PUBLICATIONS

Zhang et al., "Analysis of Verification-Based Decoding on the q-ary Symmetric Channel for Large q", IEEE Trans. on Information Theory, vol. 57, No. 10 (Oct. 2011).

Zhong et al., "Design of VLSI Implementation-Oriented LDPC Codes", IEEE, pp. 670-673, 2003.

Zhong et al., "High-Rate Quasi-Cyclic LDPC Codes for Magnetic Recording Channel with Low Error Floor", ISCAS, IEEE pp. 3546-3549, May 2006.

Zhong et al., "Joint Code-Encoder Design for LDPC Coding System VLSI Implementation", ISCAS, IEEE pp. 389-392, May 2004.

Zhong et al., "Quasi Cyclic LDPC Codes for the Magnetic Recording Channel: Code Design and VSLI Implementation", IEEE Transactions on Magnetics, v. 43, pp. 1118-1123, Mar. 7.

Zhong, "Block-LDPC: A Practical LDPC Coding System Design Approach", IEEE Trans. on Circuits, Regular Papers, vol. 5, No. 4, pp. 766-775, Apr. 2005.

\* cited by examiner

NYQUIST CONSTRAINED DIGITAL FINITE IMPULSE RESPONSE FILTER

BACKGROUND

Filters are commonly used in electronic systems such as signal processing and data processing circuits to remove noise from a data signal. A digital finite impulse response (DFIR) filter applies a mathematical operation to a digital data stream to achieve any of a wide range of desired frequency responses. As illustrated in FIG. 1, a DFIR filter 100 passes an input 102 through a series of delay elements 104, 106 and 110, multiplying the delayed signals by filter coefficients or tap weights 112, 114, 116 and 120, and summing the results to yield a filtered output 122. The outputs 130, 140 and 150 of each delay element 104, 106 and 110 and the input 102 form a tapped delay line and are referred to as taps. The number of delay elements 104, 106 and 110, and thus the number of taps 102, 130, 140 and 150 (also referred to as the order or length of the DFIR filter 100) may be increased to more finely tune the frequency response, but at the cost of increasing complexity. The DFIR filter 100 implements a filtering equation such as $Y[n]=F_0X[n]+F_1X[n-1]+F_2X[n-2]+F_3X[n-3]$ for the three-delay filter illustrated in FIG. 1, or more generally $Y[n]=F_0X[n]+F_1X[n-1]+F_2X[n-2]+ \ldots +F_3X[n-L]$, where $X[n]$ is the current input 102, the value subtracted from n represents the index or delay applied to each term, $F_i$ are the tap weights 112, 114, 116 and 120, $Y[n]$ is the output 122 and L is the filter order. The input 102 is multiplied by tap weight 112 in a multiplier 124, yielding a first output term 126. The second tap 130 is multiplied by tap weight 114 in multiplier 132, yielding a second output term 134, which is combined with first output term 126 in an adder 136 to yield a first sum 148. The third tap 140 is multiplied by tap weight 116 in multiplier 142, yielding a third output term 144, which is combined with first sum 148 in adder 146 to yield a second sum 158. The fourth tap 150 is multiplied by tap weight 120 in multiplier 152, yielding a fourth output term 154, which is combined with second sum 158 in adder 156 to yield output 122. By changing the tap weights 112, 114, 116 and 120, the filtering applied to the input 102 by the DFIR filter 100 is adjusted to select the desired pass frequencies and stop frequencies.

In a data processing circuit, an analog to digital converter (ADC) is often used upstream of a DFIR filter to convert an analog signal to a digital signal that may be filtered in the DFIR filter and otherwise processed in other circuits. The sampling phase of the ADC may be selected or varied to meet any of a number of objectives in the data processing circuit, for example to minimize bit errors. However, DFIR filters may be sensitive to the selection of the ADC sampling phase, yielding various frequency responses to different ADC sampling phases. Adjusting the ADC sampling phase based on the frequency response of the DFIR filter may further complicate the meeting of other objectives of the data processing circuit related to the ADC sampling phase, as well as being time consuming.

Thus, for at least the aforementioned reason, there exists a need in the art for reducing DFIR filter sensitivity to ADC sampling phase.

BRIEF SUMMARY

Various embodiments of the present invention provide apparatuses and methods for filtering a digital signal with a Nyquist constrained digital finite impulse response filter. For example, an apparatus for filtering digital data is disclosed that includes a digital finite impulse response filter having a plurality of taps. The apparatus also includes a tap weight controller connected to the digital finite impulse response filter, operable to adjust a tap weight for each of a subset of the taps such that a magnitude of a Nyquist response of the digital finite impulse response filter remains within a constraint range. In some cases, the Nyquist response is calculated as the sum of the tap weights for the even taps minus the tap weights for the odd taps.

In some cases, the tap weight controller is operable to calculate a tap weight offset to adjust the tap weight for each of the subset of the plurality of taps, whether the subset includes all taps for the digital finite impulse response filter or excludes some taps, such as the tap with the largest tap weight. In various cases, when the magnitude of the Nyquist response is less than a lower boundary of the range, the tap weight offset is calculated as the sign of the Nyquist response multiplied by a difference between the lower boundary of the range and the Nyquist response, divided by a number of taps in the subset of the plurality of taps, and when the magnitude of the Nyquist response is greater than an upper boundary of the range, the tap weight offset is calculated as the sign of the Nyquist response multiplied by a difference between the upper boundary of the range and the Nyquist response, divided by the number of taps in the subset of the plurality of taps. In some cases, the tap weight offset is added to the tap weight of even taps and subtracted from the tap weight of odd taps.

In some instances of the aforementioned embodiments, the apparatus includes an analog to digital converter with a variable sampling phase connected to an input of the digital finite impulse response filter. The frequency response sensitivity of the digital finite impulse response filter to the variable sampling phase of the analog to digital converter is reduced by adjusting the tap weights.

Other embodiments of the present invention provide methods for filtering a signal. The methods include providing a digital finite impulse response filter having a plurality of tap weight inputs and a tap weight controller connected to the digital finite impulse response filter. The methods also include using the tap weight controller to calculate the Nyquist response of the digital finite impulse response filter based on at least some of the plurality of tap weight inputs, determining whether the magnitude of the Nyquist response of the digital finite impulse response filter is outside of a Nyquist constraint range, and if so, calculating a tap weight offset and applying the tap weight offset to the at least some of the tap weight inputs.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals may be used throughout several drawings to refer to similar components.

DETAILED DESCRIPTION OF THE INVENTION

Various embodiments of the present invention are related to apparatuses and methods for filtering a digital signal, and more particularly to a Nyquist constrained DFIR filter. Various embodiments of the present invention constrain the magnitude of the Nyquist response of a DFIR filter to remain within a Nyquist constraint range. When the magnitude of the Nyquist response remains within the range, the sensitivity of the DFIR filter to an upstream ADC sampling phase is greatly reduced. The Nyquist response and the magnitude of the Nyquist response of the DFIR filter at time k are represented by S and by |S|, respectively, and are defined herein by Equations 1 and 2:

$$S = \sum_i (f_{2i,k} - f_{2i+1,k}) \quad \text{Equation 1}$$

$$|S| = \left| \sum_i (f_{2i,k} - f_{2i+1,k}) \right| \quad \text{Equation 2}$$

where S is the sum of the even tap weights minus the odd tap weights and |S| is the absolute value of S, where $f_{2i,k}$ represents the even tap weights (e.g., 112, 116) and $f_{2i+1,k}$ represents the odd tap weights (e.g., 114, 120). The tap weights may originally be determined in any suitable manner to set the filtering characteristics of the DFIR filter, whether now known or developed in the future. For example, a DFIR adaptation process may be used in a data processing circuit during which known inputs are provided while adjusting the tap weights to achieve the desired filtered output corresponding to the known inputs, either using calculations, searching algorithms or any other technique to find the tap weights that yield the desired filtering characteristics. In some embodiments, the tap weights may be calculated by determining the desired frequency response that stops unwanted frequencies and passes the wanted frequencies, then calculating the inverse Fourier transform of the desired frequency response, and using the results as the tap weights.

The magnitude of the Nyquist response for the resulting tap weights is then checked to ensure that it falls within the desired range, and if not, they are adjusted as will be disclosed in more detail below. By ensuring that the magnitude of the Nyquist response remains within the range, the sensitivity of the DFIR filter to the sampling phase of an upstream ADC is considerably reduced. This renders the data processing circuit more stable and robust and precludes time consuming adjustments to the ADC sampling phase to maintain the desired DFIR filter frequency response.

Figure 2:
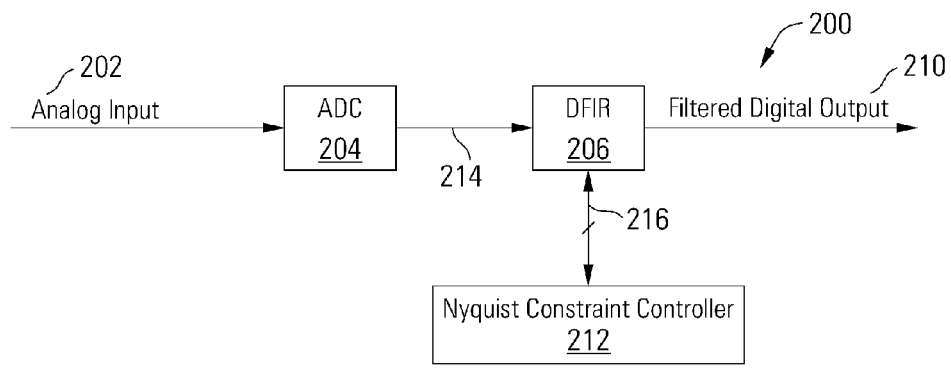
FIG. 2 depicts a Nyquist constrained DFIR filter and ADC in accordance with some embodiments of the present invention.

Turning to FIG. 2, a data processing circuit 200 is illustrated including a Nyquist constrained DFIR filter 206. An analog input 202 is provided to an ADC 204, which converts the analog signal at the analog input 202 to a digital signal 214. In some embodiments, the sampling phase of the ADC 204 may be selected to meet various requirements in the data processing circuit 200, for example by adjusting or delaying the clock signal to the ADC 204. The digital signal 214 is provided to the DFIR filter 206, which filters the digital signal 214, substantially passing some frequencies and partially or fully blocking other frequencies according to tap weights 216 which are applied to the DFIR filter 206 to set the desired frequency response. The output 210 is thus a filtered version of analog input 202, with frequency components of the analog input 202 that fall within the passband substantially unchanged or even slightly amplified in the output 210, and with frequency components of the analog input 202 that fall within the stopband attenuated or substantially blocked. The initial tap weights to apply to the DFIR filter 206 to establish the desired frequency response may be calculated or otherwise determined in any suitable manner. In some embodiments, tap weights are floating point numbers, in others, tap weights are integers. A Nyquist constraint controller 212, also referred to generally as a tap weight controller, processes the initial tap weights to determine whether the associated Nyquist response magnitude |S| given by Equation 2 falls within a particular range, and if not, applies a Nyquist constraint to them so that they do fall within the range, before applying the resulting tap weights 216 to the DFIR filter 206.

The Nyquist constraint applied to the tap weights 216 is given by Equation 3:

$$\text{Nyq\_low} \leq \left| \sum_i (f_{2i,k} - f_{2i+1,k}) \right| \leq \text{Nyq\_high} \quad \text{Equation 3}$$

where Nyq_low and Nyq_high are the lower and upper boundaries of the range, respectively, and 0<Nyq_low≤Nyq_high. When |S| remains within the range established by Nyq_low and Nyq_high, the sensitivity of the DFIR filter 206 to the sampling phase of the ADC 204 is greatly diminished. The boundaries Nyq_low and Nyq_high may be set experimentally by trial and error in order to reduce the sensitivity of the DFIR filter 206 to the ADC sampling phase. Generally, if the signal has higher Nyquist energy, the lower boundary is set higher; otherwise, the lower boundary is set lower.

Each time new tap weights are calculated for the DFIR filter 206, for example during or after DFIR adaptation iterations in a data processing circuit, the Nyquist constraint controller 212 again processes the initial tap weights to determine whether the associated Nyquist response magnitude |S| given by Equation 2 falls within a particular range. If not, the Nyquist constraint controller 212 applies the Nyquist constraint to them to move them into the range, before the resulting tap weights 216 are provided to the DFIR filter 206. The Nyquist constraint is applied by calculating a tap weight offset Δ that adjusts the initial tap weights if the associated Nyquist response magnitude |S| would otherwise fall outside the range as indicated by Equation 3. The tap weight offset Δ is calculated in some embodiments according to Equation 4:

$$\Delta = \begin{cases} \text{sgn}(S) \cdot (\text{Nyq\_low} - S)/L, & \text{if } |S| < \text{Nyq\_low} \\ \text{sgn}(S) \cdot (\text{Nyq\_high} - S)/L, & \text{if } |S| > \text{Nyq\_high} \end{cases} \quad \text{Equation 4}$$

where S is the Nyquist response calculated according to Equation 1, sgn(S) is the sign of the Nyquist response, either −1 or 1, and where L is the number of taps being constrained. L may be set to the total number of taps in the DFIR filter, for example, 4 in the DFIR filter 100 of FIG. 1, or may be less than the total number of taps. For example, in some embodiments the tap with the largest tap weight may be left unconstrained, and L is the total number of taps minus one. In other embodiments, L may be an even smaller portion of the total number of taps. L may be even or odd. In the case in which the associated Nyquist response magnitude |S| is lower than the Nyq_low limit, the tap weight offset Δ is calculated as the sign of the Nyquist response S, either −1 or 1, multiplied by the difference of the Nyq_low limit minus the Nyquist response S, divided by the number of taps to be constrained L. When the associated Nyquist response magnitude is higher than the Nyq_high limit, the tap weight offset Δ is calculated as the sign of the Nyquist response S, either −1 or 1, multiplied by the difference of the Nyq_high limit minus the Nyquist response S, divided by the number of taps to be constrained L.

The tap weight offset Δ is applied in some embodiments according to Equations 5 and 6:

$$f_{2i,k} = f_{2i,k} + \Delta$$

Equation 5

$$f_{2i+1,k} = f_{2i+1,k} - \Delta$$

Equation 6

The tap weight offset Δ is added to each even tap and is subtracted from each odd tap. If L is even, the number of even taps and odd taps is the same, so the even and odd taps will receive a balanced offset due to the tap weight offset Δ. If L is odd, there will either be more even taps or odd taps, and the tap weight offset Δ will therefore be applied to more of either the even taps or odd taps. If the DFIR filter 206 is adapted to use integer tap weights, the Nyquist constrained tap weights may be rounded, truncated or otherwise converted to integers from floating point numbers if the application of the tap weight offset Δ results in floating point numbers.

Figure 1:
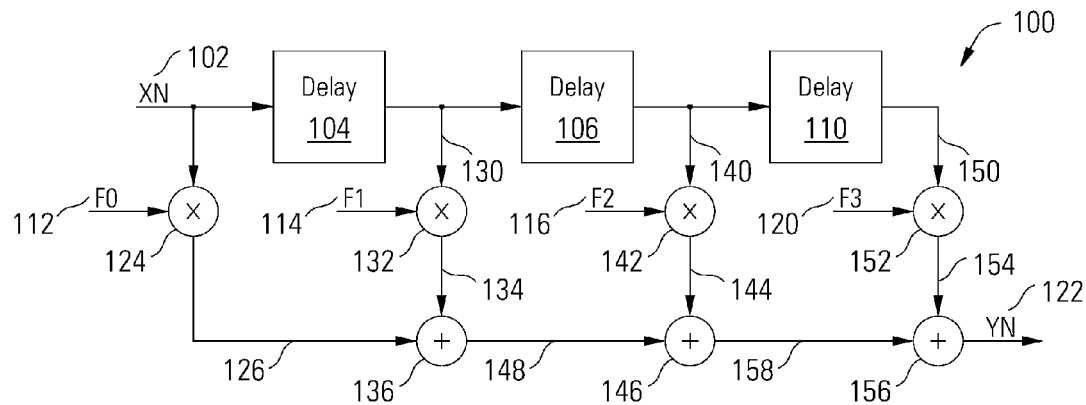
FIG. 1 depicts a prior art DFIR filter.

As an example illustration using arbitrary numbers, given a FIR filter with four taps as in FIG. 1, and using floating point tap weights F0, F1, F2 and F3 of 0.1, 0.4, 0.5, 0.3, the Nyquist response S is (0.1−0.4)+(0.5−0.3) or −0.1. If Nyq_low is 0.2 and Nyq_high is 0.6, the Nyquist response magnitude |S| given by Equation 2 is 0.1, so the initial tap weights fall outside the Nyquist constraint of Equation 3. Because the Nyquist response magnitude |S| is less than Nyq_low, the tap weight offset Δ is calculated using Equation 4 as −1(0.2−0.1)/4=−0.025, where sgn(S) is −1 and L is 4 to apply the tap weight offset Δ to all four taps. To apply the tap weight offset, the first constrained tap weight F0, being an even tap, is the initial value of 0.1 plus the tap weight offset Δ of −0.025 or 0.075. The second constrained tap weight F1, being an odd tap, is the initial value of 0.4 minus the tap weight offset Δ of −0.025 or 0.425. The third constrained tap weight F2, being an even tap, is 0.5+(−0.025) or 0.475. The fourth constrained tap weight F3, being an odd tap, is 0.3−(−0.025) or 0.325. Given the constrained tap weights 0.075, 0.425, 0.475, 0.325, the Nyquist response magnitude |S| given by Equation 2 is −0.2, now meeting the Nyquist constraint of Equation 3.

Figure 3:
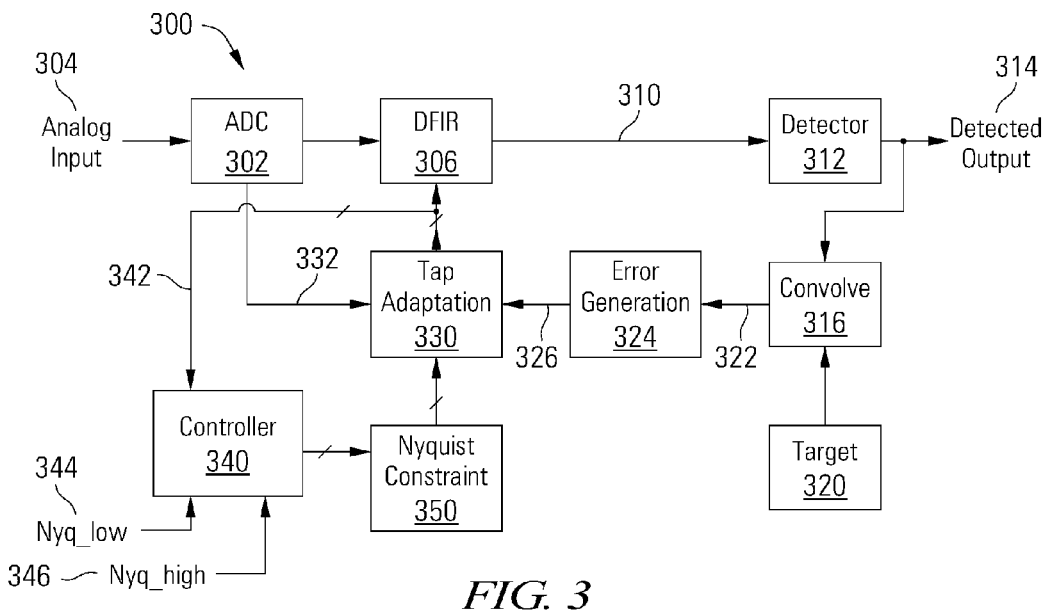
FIG. 3 depicts a read channel circuit for a storage system or wireless communication system that includes a Nyquist constrained DFIR filter in accordance with some embodiments of the present invention.

Turning to FIG. 3, a read channel circuit 300 for a storage system or wireless communication system is illustrated as an example application of a Nyquist constrained DFIR filter in accordance with some embodiments of the present invention. However, it is important to note that the Nyquist constrained DFIR filter disclosed herein is not limited to any particular application such as the read channel circuit 300 of FIG. 3.

The read channel circuit 300 may be used, for example, to process data from a storage system or wireless communication system. Read channel circuit 300 includes an analog to digital converter (ADC) 302 that converts the analog input signal 304 into a series of digital samples that are provided to DFIR filter 306. DFIR filter 306 acts as an equalizer on the digital samples from the ADC 302, compensating for inter-symbol interference (ISI) resulting from data being transmitted at high speed through band-limited channels and filtering the received input to provide a corresponding filtered output 310 to a detector circuit 312, such as a Viterbi decoder. Detector circuit 312 performs a data detection process on the received input resulting in a detected output 314. In performing the detection process, detector circuit 312 attempts to correct any errors in the received data input.

Detected output 314 is provided to a partial response (PR) target circuit 316 that is operable to convolve the detected output 314 with a partial response target 320 to create a partial response output 322 as the derivative of the detected output 314. An error generator 324 generates an error signal 326 based at least in part on the partial response output 322. The error signal 326 is used by a tap adaptation circuit 330 to adjust the tap weights provided to the DFIR filter 306. Other inputs may also be used by the tap adaptation circuit 330 to adjust tap weights, such as a tap adaptation signal 332 from the ADC 302 to provide information to the tap adaptation circuit 330 during tap adaptation processes. In some embodiments, tap values are initially calculated, for example during an adaptation iteration based on the tap adaptation signal 332, and are then adjusted during run time in the tap adaptation circuit 330 based on quantities such as the error signal 326.

A Nyquist constraint controller 340 reads the tap weights 342 applied to the DFIR filter 306 by the tap adaptation circuit 330, determining whether Nyquist response magnitude |S| established by tap weights 342 falls outside the range as indicated by Equation 3. A Nyq_low signal 344 and Nyq_high signal 436 may be provided to the Nyquist constraint controller 340 as external parameters to establish and variably control the range of Equation 3. In other embodiments, the values for Nyq_low and Nyq_high may be fixed in the design of the Nyquist constraint controller 340. If Nyquist constraint controller 340 determines that Nyquist response magnitude |S| falls outside the range in Equation 3, a tap weight offset Δ 350 is provided by the Nyquist constraint controller 340 to the tap adaptation circuit 330 to constrain the tap weights 342. With the tap weights 342 constrained by the Nyquist constraint controller 340 to remain within the range established in Equation 3, the DFIR filter 306 is less sensitive to the sampling phase of the ADC 302.

Figure 4A:
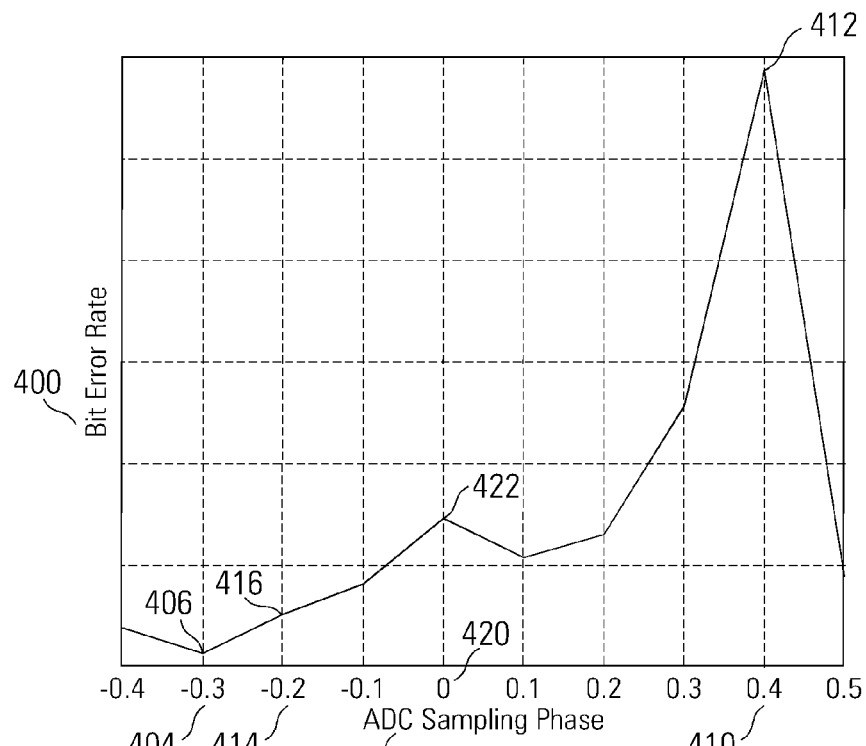
FIG. 4A is a plot of bit error rate versus ADC sampling phase in a read channel circuit with a DFIR filter in accordance with some embodiments of the present invention with Nyquist constraint disabled.
Figure 4B:
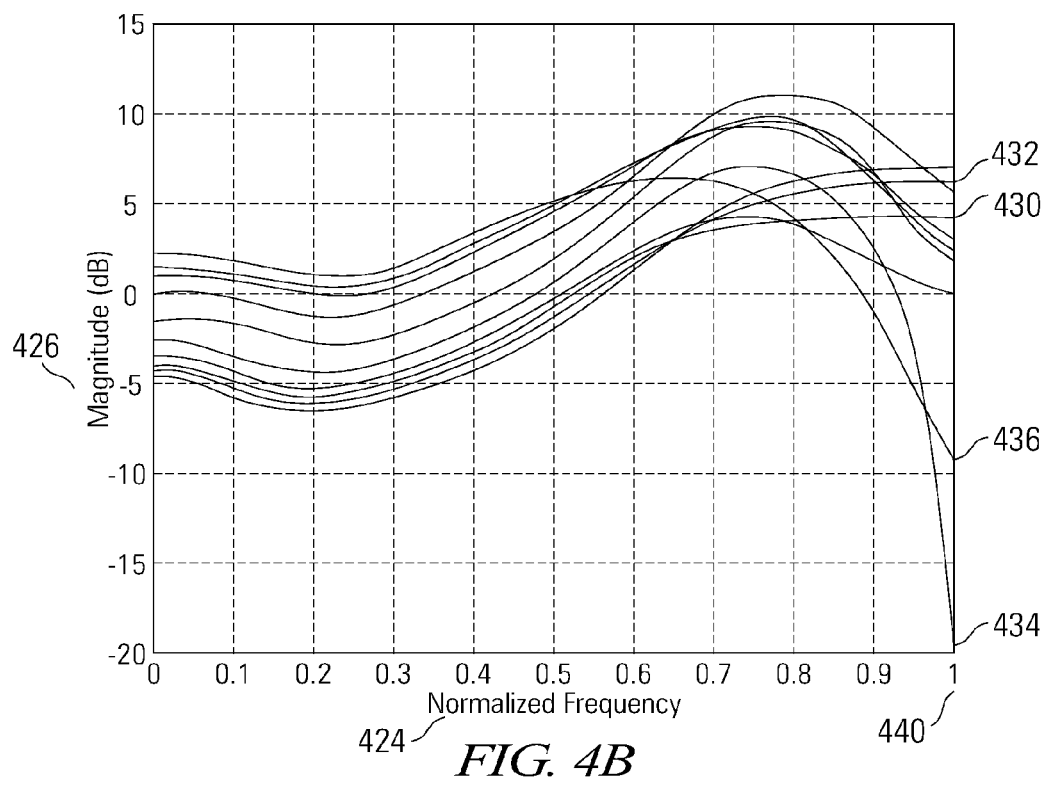
FIG. 4B is a plot of DFIR filter frequency response as a function of frequency normalized to the ADC sampling frequency in a read channel circuit with a DFIR filter in accordance with some embodiments of the present invention with Nyquist constraint disabled.

Turning to FIGS. 4A, 4B, 5A and 5B, comparisons of the frequency response of a DFIR filter (e.g., 206 and 306) with Nyquist constraints disabled and enabled are illustrated. FIG. 4A is a plot of bit error rate 400 versus ADC sampling phase 402 in a read channel circuit with a DFIR filter (e.g., 206 and 306) in accordance with some embodiments of the present invention with Nyquist constraint (e.g., 212, 340) disabled. The ADC sampling phase 402 corresponds to the X axis, ranging from a −0.4 cycle phase shift to a 0.5 cycle phase shift. As shown in FIG. 4A, the bit error rate 400 of a read channel circuit varies according to ADC sampling phase 402, with a sampling phase of −0.3 404 producing a minimum 406 in the bit error rate 400 in this example and a sampling phase of 0.4 410 producing a peak 412 in the bit error rate 400. Other sampling phases (e.g., −0.2 414) produce a bit error rate 416 close to that of −0.3 404, and others (e.g., sampling phase 0 420) produce higher bit error rates such as peak 422.

The resulting frequency responses in a DFIR filter (e.g., 206 and 306) for these ADC sampling phases 402 are illustrated in FIG. 4B, again with the Nyquist constraints on the tap weights for the DFIR filter (e.g., 206 and 306) disabled. The frequency response of the DFIR filter (e.g., 206 and 306) is plotted as normalized frequency 424 on the X axis versus magnitude 426 on the Y axis, with the frequency normalized to the Nyquist sampling frequency of the ADC. Some of the sampling phases 404 and 414 produce substantially flat frequency responses 430 and 432, respectively, while other sampling phases 422 and 412 produce suppressed Nyquist frequency responses 434 and 436, respectively, near the normalized Nyquist frequency 440. The DFIR filter may be sensitive to the sampling phase of an upstream ADC for a variety of reasons, such as the signal spectrum in the upstream analog signal being sampled by the ADC. If the analog signal contains excessive bandwidth, that is, energy at frequencies beyond half of the sampling frequency, that out-of-band energy is not totally eliminated at the ADC due to the non-ideal additive bias of the ADC. The residual out-of-band energy sampled by the ADC causes the DFIR filter to be sensitive to the sampling phase of the ADC when the tap weights are unconstrained.

Notably, while at first glance it appears there may be some correlation between a low bit error rate 400 and flat frequency response 424, the selection of an ADC sampling phase 402 that yields a relatively low bit error rate 400 does not necessarily result in a flat frequency response 424. For example, selecting ADC sampling phase 0 420 yields a bit error rate 422 that is relatively close to the best available bit error rate 406 at sampling phase −0.3 404, and substantially better than the bit error rate 412 at sampling phase 0.4 410, and yet the suppressed frequency response 434 produced by ADC sampling phase 0 420 is much worse than that 436 produced by ADC sampling phase 0.4 410. Thus, although it may appear that there is some correlation between ADC sampling phases that yield the best bit error rate and those that provide the best Nyquist response in the DFIR filter (e.g., 206 and 306), there is no guarantee that an ADC sampling phase will not be selected based on various selection criteria that will result in a suppressed Nyquist response in the DFIR filter (e.g., 206 and 306) given the sensitivity of the
DFIR filter (e.g., 206 and 306) to the ADC sampling phase when the Nyquist constraint on the tap weights is disabled or otherwise not used.

Figure 5A:
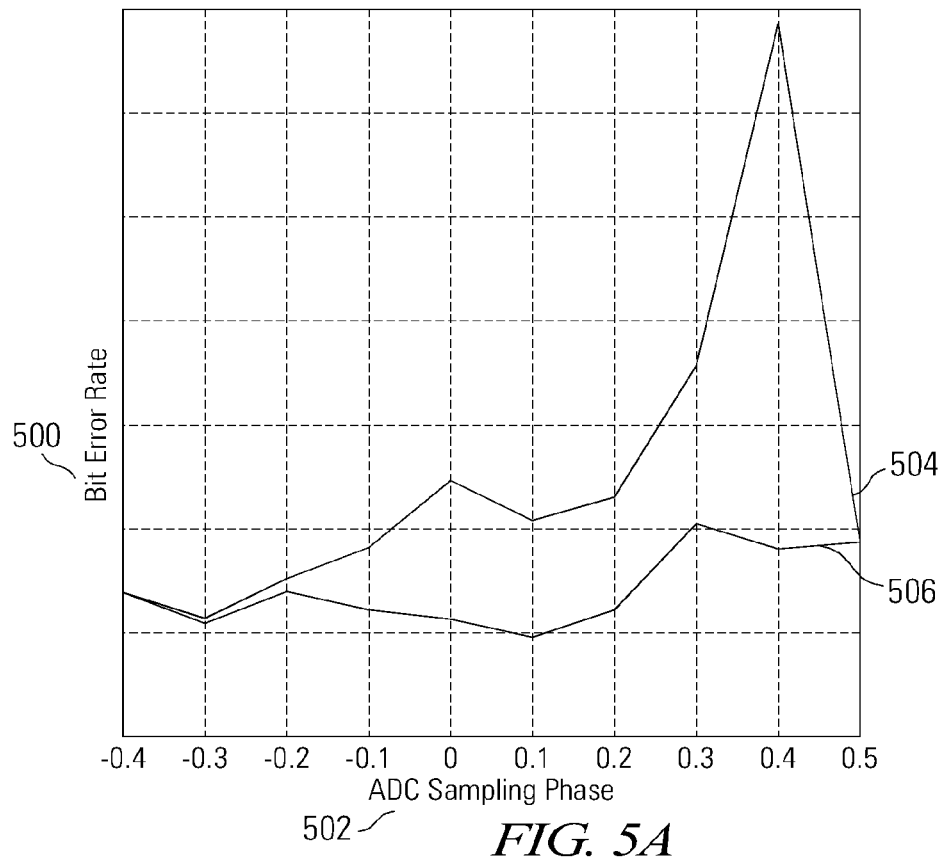
FIG. 5A is a plot of bit error rate versus ADC sampling phase in a read channel circuit with a DFIR filter in accordance with some embodiments of the present invention with Nyquist constraint enabled.

Turning to FIG. 5A, a plot illustrates bit error rate 500 versus ADC sampling phase 502 in a read channel circuit with a DFIR filter (e.g., 206 and 306) in accordance with some embodiments of the present invention with Nyquist constraint (e.g., 212, 340) enabled. A bit error rate plot 504 again illustrates the bit error rate 500 as a function of ADC sampling phase 502 with the Nyquist constraint disabled, and a bit error rate plot 506 illustrates the difference in the bit error rate 500 with the Nyquist constraint enabled for the DFIR filter (e.g., 206 and 306) in accordance with some embodiments of the present invention. As the sensitivity of the DFIR filter (e.g., 206 and 306) to the ADC sampling phase is reduced by enabling the Nyquist constraint on the tap weights for the DFIR filter, the bit error rate of the read channel is also improved.

Figure 5B:
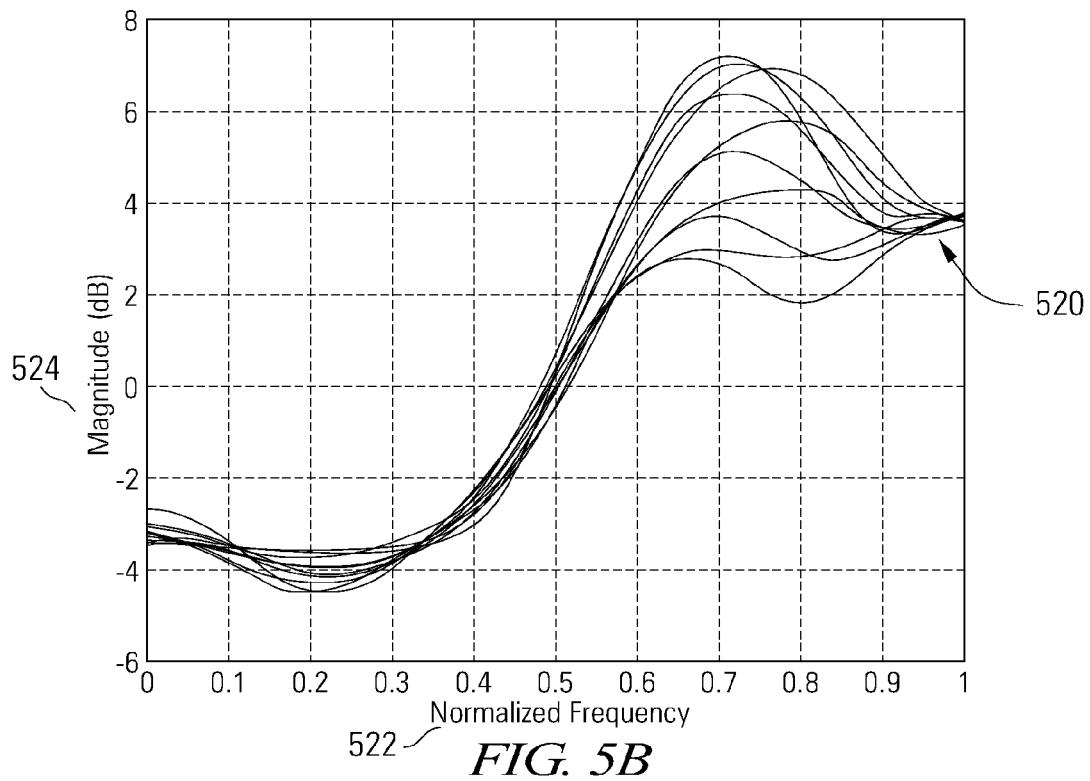
FIG. 5B is a plot of DFIR filter frequency response as a function of frequency normalized to the ADC sampling frequency in a read channel circuit with a DFIR filter in accordance with some embodiments of the present invention with Nyquist constraint enabled.

Turning to FIG. 5B, the frequency responses 520 in a DFIR filter (e.g., 206 and 306) for the ADC sampling phases 502 are illustrated for a DFIR filter (e.g., 206 and 306) with the Nyquist constraints on the tap weights enabled. Again, the frequency responses 520 of the DFIR filter (e.g., 206 and 306) for various ADC sampling phases 502 are plotted as normalized frequency 522 on the X axis versus magnitude 524 on the Y axis, with the frequency normalized to the Nyquist sampling frequency of the ADC. Notably, the frequency responses 520 are much more uniform with Nyquist constraints on tap weights, particularly at the normalized Nyquist frequency 526, than the frequency responses (e.g., 434, 436) illustrated in FIG. 4B when Nyquist constraints are not applied to tap weights. The Nyquist constrained DFIR filter greatly reduces sensitivity of the DFIR filter to the sampling phase of an upstream ADC.

Figure 6:
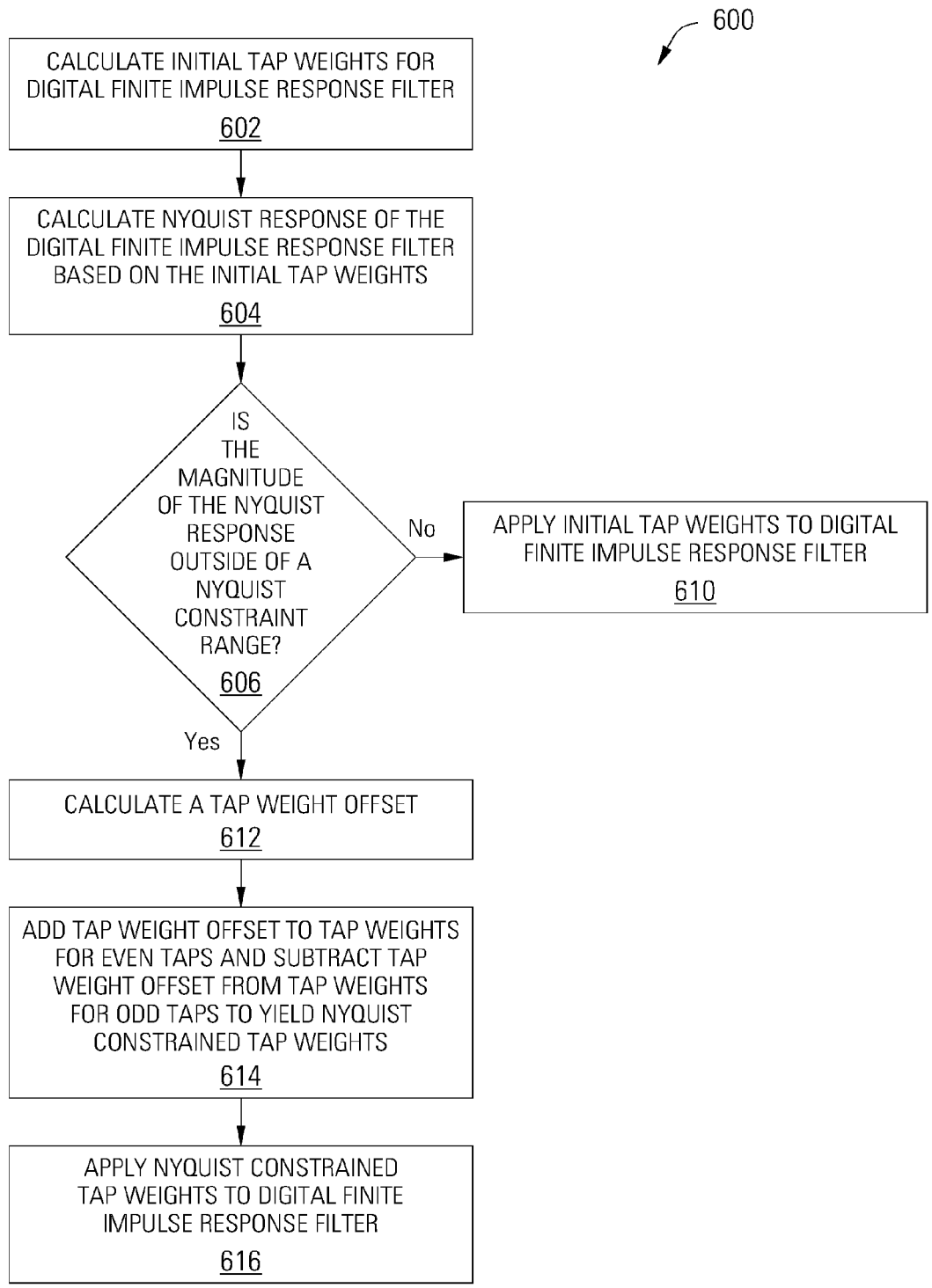
FIG. 6 is a flow diagram illustrating a method for setting tap weights for a DFIR filter in accordance with some embodiments of the present invention.

Turning to FIG. 6, a flow diagram 600 shows a method for setting tap weights for a DFIR filter in accordance with some embodiments of the present invention. Following flow diagram 600, initial tap weights are calculated for a DFIR filter. (Block 602) The initial tap weights may be calculated in any suitable manner as disclosed above, for example by calculating the inverse Fourier transform of the desired frequency response, and using the results as the initial tap weights, or by adjusting the initial tap weights during a DFIR adaptation process during which known inputs are provided while adjusting the tap weights to achieve the desired filtered output corresponding to the known inputs, or by any other technique or combination of techniques. The Nyquist response of the DFIR filter is calculated based on the initial tap weights, for example using Equation 1. (Block 604) A determination is made as to whether the magnitude of the Nyquist response falls outside of a Nyquist constraint range, for example according to Equation 3. (Block 606) If the magnitude of the Nyquist response is within the Nyquist constraint range, the initial tap weights are applied to the DFIR filter. (Block 610) If the magnitude of the Nyquist response is outside the Nyquist constraint range, a tap weight offset is calculated as disclosed above, for example according to Equation 4. (Block 612) The tap weight offset is added to tap weights for even taps and subtracted from tap weights for odd taps to yield Nyquist constrained tap weights. (Block 614) The Nyquist constrained tap weights are applied to the DFIR filter to set the frequency response of the DFIR filter while reducing sensitivity to an upstream ADC sampling phase. The method for setting tap weights for a DFIR filter illustrated in flow diagram 600 may be applied within a method for digitally filtering a data signal, including converting an analog signal to a digital signal, determining the tap weights as illustrated in flow diagram 600 of FIG. 6, and filtering the data signal in the DFIR filter with the resulting tap weights.

Figure 7:
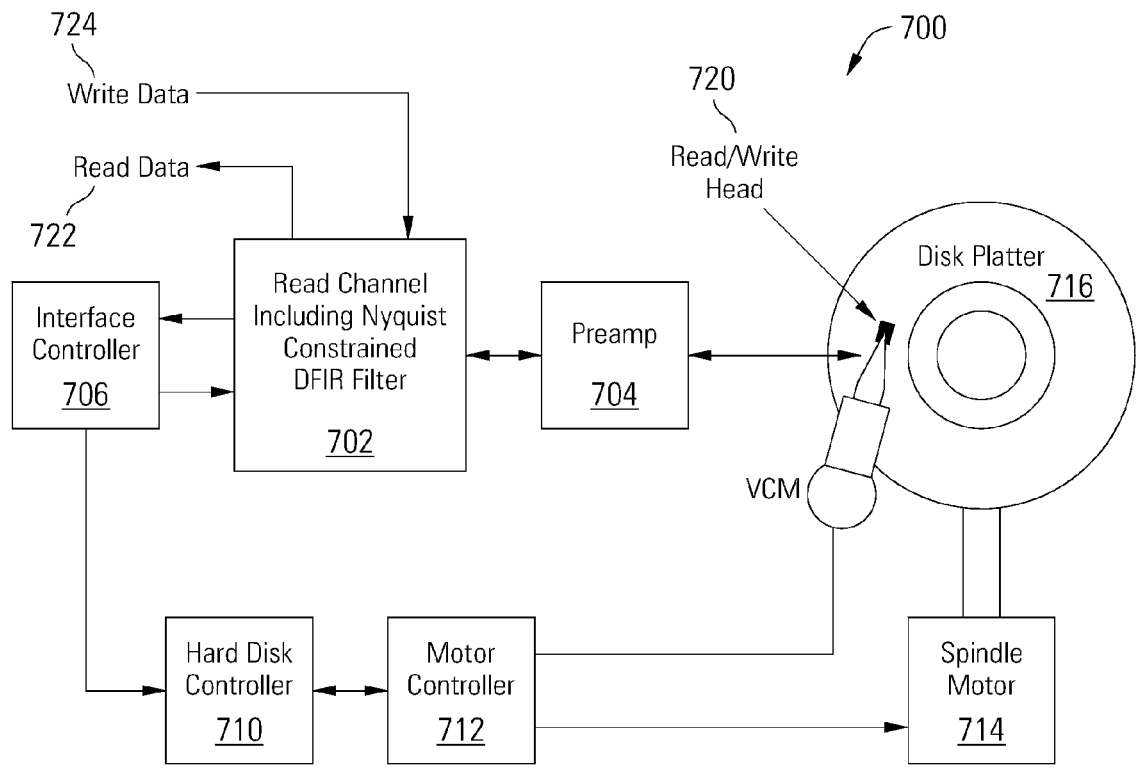
FIG. 7 depicts a storage system including a read channel circuit with a Nyquist constrained DFIR filter in accordance with some embodiments of the present invention.

Turning to FIG. 7, a storage system 700 is illustrated as an example application of a Nyquist constrained DFIR filter in accordance with some embodiments of the present invention.

However, it is important to note that the Nyquist constrained DFIR filter disclosed herein is not limited to any particular application such as the storage system 700 of FIG. 7. The storage system 700 includes a read channel circuit 702 with a Nyquist constrained DFIR filter in accordance with some embodiments of the present invention. Storage system 700 may be, for example, a hard disk drive. Storage system 700 also includes a preamplifier 704, an interface controller 706, a hard disk controller 710, a motor controller 712, a spindle motor 714, a disk platter 716, and a read/write head assembly 720. Interface controller 706 controls addressing and timing of data to/from disk platter 716. The data on disk platter 716 consists of groups of magnetic signals that may be detected by read/write head assembly 720 when the assembly is properly positioned over disk platter 716. In one embodiment, disk platter 716 includes magnetic signals recorded in accordance with either a longitudinal or a perpendicular recording scheme.

In a typical read operation, read/write head assembly 720 is accurately positioned by motor controller 712 over a desired data track on disk platter 716. Motor controller 712 both positions read/write head assembly 720 in relation to disk platter 716 and drives spindle motor 714 by moving read/write head assembly 720 to the proper data track on disk platter 716 under the direction of hard disk controller 710. Spindle motor 714 spins disk platter 716 at a determined spin rate (RPMs). Once read/write head assembly 720 is positioned adjacent the proper data track, magnetic signals representing data on disk platter 716 are sensed by read/write head assembly 720 as disk platter 716 is rotated by spindle motor 714. The sensed magnetic signals are provided as a continuous, minute analog signal representative of the magnetic data on disk platter 716. This minute analog signal is transferred from read/write head assembly 720 to read channel circuit 702 via preamplifier 704. Preamplifier 704 is operable to amplify the minute analog signals accessed from disk platter 716. In turn, read channel circuit 702 decodes and digitizes the received analog signal to recreate the information originally written to disk platter 716. This data is provided as read data 722 to a receiving circuit. As part of decoding the received information, read channel circuit 702 processes the received signal using a Nyquist constrained DFIR filter. Such a Nyquist constrained DFIR filter may be implemented consistent with that disclosed above in relation to FIGS. 2-5. In some cases, the filtering may be performed consistent with the flow diagram disclosed above in relation to FIG. 6. A write operation is substantially the opposite of the preceding read operation with write data 724 being provided to read channel circuit 702. This data is then encoded and written to disk platter 716.

It should be noted that storage system 700 may be integrated into a larger storage system such as, for example, a RAID (redundant array of inexpensive disks or redundant array of independent disks) based storage system. It should also be noted that various functions or blocks of storage system 700 may be implemented in either software or firmware, while other functions or blocks are implemented in hardware.

Figure 8:
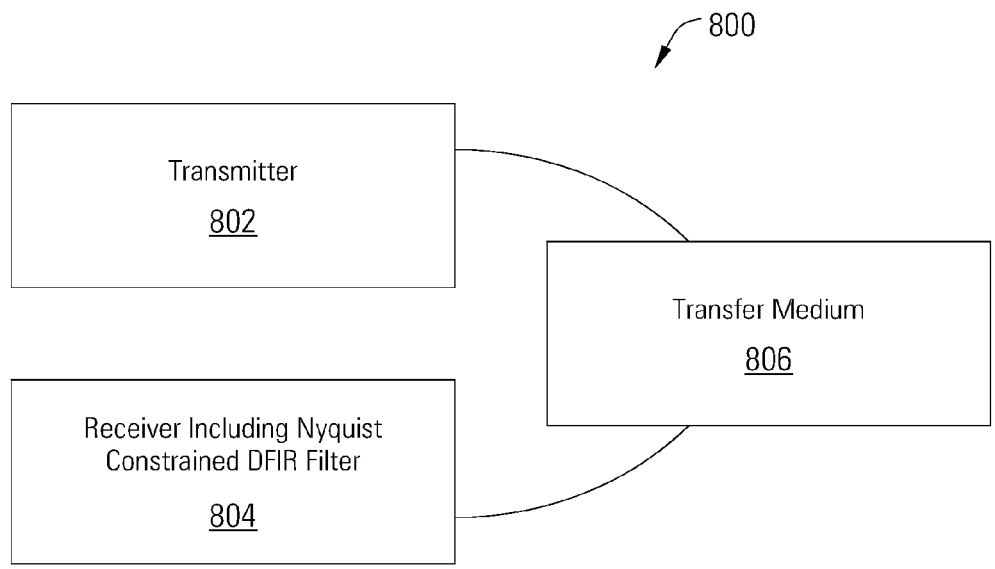
FIG. 8 depicts a wireless communication system including a receiver with a Nyquist constrained DFIR filter in accordance with some embodiments of the present invention.

Turning to FIG. 8, a wireless communication system 800 including a receiver 804 with a Nyquist constrained DFIR filter is shown in accordance with some embodiments of the present invention. Communication system 800 includes a transmitter 802 that is operable to transmit encoded information via a transfer medium 806 as is known in the art. The encoded data is received from transfer medium 806 by receiver 804. Receiver 804 incorporates a Nyquist constrained DFIR filter. Such a Nyquist constrained DFIR filter may be implemented consistent with that described above in relation to FIGS. 2-5. In some cases, the analog to digital conversion may be done consistent with the flow diagram discussed above in relation to FIG. 6.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit.

It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel apparatuses and methods for a Nyquist constrained DFIR filter. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An apparatus for filtering digital data, comprising:
   a digital finite impulse response filter having a plurality of taps; and
   a tap weight controller connected to the digital finite impulse response filter operable to adjust a tap weight for each of a subset of the plurality of taps such that a magnitude of a Nyquist response of the digital finite impulse response filter remains within a constraint range.

2. The apparatus of claim 1, wherein the subset of the plurality of taps comprises a plurality of even taps and a plurality of odd taps, and wherein the Nyquist response comprises a sum of the tap weights for the even taps minus the tap weights for the odd taps.

3. The apparatus of claim 1, wherein the constraint range comprises a lower boundary and an upper boundary, wherein the lower boundary is greater than zero and wherein the upper boundary is greater than or equal to the lower boundary.

4. The apparatus of claim 1, wherein the subset of the plurality of taps comprises less than all of the plurality of taps.

5. The apparatus of claim 4, wherein the subset of the plurality of taps includes all the plurality of taps except a tap having a largest tap weight.

6. The apparatus of claim 1, wherein the subset of the plurality of taps comprises all of the plurality of taps of the digital finite impulse response filter.

7. The apparatus of claim 1, wherein the tap weight controller is adapted to calculate a tap weight offset to be used to adjust the tap weight for each of the subset of the plurality of taps.

8. The apparatus of claim 7, wherein when the magnitude of the Nyquist response is less than a lower boundary of the constraint range, the tap weight offset comprises a sign of the Nyquist response multiplied by a difference between the lower boundary of the constraint range and the Nyquist response, divided by a number of taps in the subset of the plurality of taps, and when the magnitude of the Nyquist response is greater than an upper boundary of the constraint range, the tap weight offset comprises the sign of the Nyquist response multiplied by a difference between the upper boundary of the constraint range and the Nyquist response, divided by the number of taps in the subset of the plurality of taps.

9. The apparatus of claim 7, wherein the subset of the plurality of taps comprises a plurality of even taps and a plurality of odd taps, wherein the tap weight controller is adapted to adjust the tap weight for each of the subset of the plurality of taps by adding the tap weight offset to the tap weight of each of the plurality of even taps and by subtracting the tap weight offset from the tap weight of each of the plurality of odd taps.

10. The apparatus of claim 1, further comprising an analog to digital converter connected to an input of the digital finite impulse response filter, the analog to digital converter comprising a variable sampling phase, wherein a frequency response sensitivity of the digital finite impulse response filter to the variable sampling phase of the analog to digital converter is reduced by the adjusting of the tap weights.

11. The apparatus of claim 1, wherein the digital finite impulse response filter and the tap weight controller are implemented as an integrated circuit.

12. The apparatus of claim 1, wherein the digital finite impulse response filter and the tap weight controller are incorporated in a storage device.

13. The apparatus of claim 1, wherein the digital finite impulse response filter and the tap weight controller are incorporated in a data transmission device.

14. A method for filtering a signal, comprising:
providing a digital finite impulse response filter having a plurality of tap weight inputs;
providing a tap weight controller connected to the digital finite impulse response filter;
using the tap weight controller, calculating a Nyquist response of the digital finite impulse response filter based on at least some of the plurality of tap weight inputs;
determining whether a magnitude of the Nyquist response of the digital finite impulse response filter is outside of a Nyquist constraint range; and
if the magnitude of the Nyquist response of the digital finite impulse response filter is outside of the Nyquist constraint range, calculating a tap weight offset and applying the tap weight offset to the at least some of the plurality of tap weight inputs.

15. The method of claim 14, wherein calculating the Nyquist response of the digital finite impulse response filter comprises calculating a sum of the tap weight inputs which are even minus the tap weight inputs which are odd.

16. The method of claim 14, wherein calculating the tap weight offset comprises, when the magnitude of the Nyquist response is less than a lower boundary of the Nyquist constraint range, multiplying a sign of the Nyquist response by a difference between the lower boundary of the Nyquist constraint range and the Nyquist response, and dividing by a number of taps in the at least some of the plurality of tap weight inputs, and when the magnitude of the Nyquist response is greater than an upper boundary of the range, multiplying the sign of the Nyquist response by a difference between the upper boundary of the Nyquist constraint range and the Nyquist response, and dividing by the number of taps in the at least some of the plurality of tap weight inputs.

17. The method of claim 14, wherein the at least some of the plurality of tap weight inputs comprises a plurality of even taps and a plurality of odd taps, and wherein applying the tap weight offset to the at least some of the plurality of tap weight inputs comprises adding the tap weight offset to the plurality of even taps and subtracting the tap weight offset from the plurality of odd taps.

18. A storage system comprising:
a storage medium maintaining a data set;
a read/write head assembly operable to sense the data set on the storage medium and to provide an analog output corresponding to the data set;
an amplifier circuit operable to amplify the analog output to yield an amplified analog output;
an analog to digital converter operable to sample the amplified analog output to yield a digital signal;
a digital finite impulse response filter operable to filter the digital signal; and
a tap weight controller operable to provide a tap weight to each of a plurality of tap weight inputs on the digital finite impulse response filter, wherein the tap weight controller is operable further operable to adjust the tap weights for each of a subset of the plurality of tap weight inputs such that a magnitude of a Nyquist response of the digital finite impulse response filter remains within a Nyquist constraint range.

19. The storage system of claim 18, wherein the tap weight controller is further operable to determine whether a plurality of initial tap weights for each of the subset of the plurality of tap weight inputs place the magnitude of the Nyquist response of the digital finite impulse response filter within the Nyquist constraint range.

20. The storage system of claim 18, wherein the tap weight controller is further operable to calculate a tap weight offset and to combine the tap weight offset with the tap weights for each of the subset of the plurality of tap weight inputs such that the magnitude of the Nyquist response of the digital finite impulse response filter remains within the Nyquist constraint range.

* * * * *